United States Patent
Anderson et al.

[11] Patent Number: 5,882,999
[45] Date of Patent: Mar. 16, 1999

[54] PROCESS FOR METALLIZATION OF AN INSULATION LAYER

[75] Inventors: Christine Ann Anderson, Frisco, Colo.; Edward Daniel Buker, Underhill Center, Vt.; John Edward Cronin, Milton, Vt.; Gloria Jean Kerszykowski, Williston, Vt.; David Charles Thomas, Richmond, Vt.

[73] Assignee: International Business Machines Corporation, Armonk, N.Y.

[21] Appl. No.: 692,319

[22] Filed: Aug. 5, 1996

Related U.S. Application Data

[63] Continuation of Ser. No. 290,402, Aug. 15, 1994, abandoned.

[51] Int. Cl.⁶ .................. H01L 21/283; H01L 21/311
[52] U.S. Cl. .................. 438/629; 438/633; 438/636; 438/637; 438/648
[58] Field of Search .................. 437/195, 228, 437/229, 190, 192; 756/644.1, 659.11; 438/622, 625, 626, 628, 629, 631, 636, 637, 648

[56] References Cited

U.S. PATENT DOCUMENTS

| | | | |
|---|---|---|---|
| 4,657,628 | 4/1987 | Holloway et al. | 156/643 |
| 4,770,479 | 9/1988 | Tustison | 350/1.6 |
| 4,789,648 | 12/1988 | Chow et al. | 437/225 |
| 4,826,785 | 5/1989 | McClure et al. | 437/174 |
| 4,884,123 | 11/1989 | Dixit et al. | 437/190 |
| 5,124,780 | 6/1992 | Sandhu et al. | 357/67 |
| 5,152,869 | 10/1992 | Ferraris et al. | 156/652 |
| 5,173,442 | 12/1992 | Carey | 437/173 |
| 5,219,788 | 6/1993 | Abernathey et al. | 437/187 |
| 5,225,372 | 7/1993 | Savkar et al. | 437/190 |
| 5,403,781 | 4/1995 | Matsumoto et al. | 437/195 |

FOREIGN PATENT DOCUMENTS

| | | |
|---|---|---|
| 0 499 433 A2 | 8/1992 | European Pat. Off. |
| 0 525 942 A2 | 2/1993 | European Pat. Off. |
| 5-47936 | 2/1993 | Japan |
| 2 257 564 | 1/1993 | United Kingdom |

OTHER PUBLICATIONS

Kikuta et al. "Multilevel Planarized —Trench—Aluminum (PTA) Interconnection . . . " IEEE IEDM Tech. Dig, Dec. 1993, pp. 285–288.

*Primary Examiner*—T. N. Quach
*Attorney, Agent, or Firm*—Heslin & Rothenberg, P.C.

[57] ABSTRACT

A process for making metal features in an insulator layer in integrated circuits is disclosed. The process involves depositing an antireflective coating layer of a material such as TiN over the insulator layer patterning both the ARC and the insulator with a series of channels or apertures vias and depositing a metal such as tungsten over the ARC and in the channels and apertures. The metal can then be planarized by CMP using the insulator as an etch top.

15 Claims, 6 Drawing Sheets

PROCESS FOR METALLIZATION OF AN INSULATION LAYER

This application is a continuation of application Ser. No. 08/290,402 filed Aug. 15, 1994, now abandoned.

FIELD OF THE INVENTION

The invention relates to a process for making metal features in an insulator layer for integrated circuit fabrication.

BACKGROUND OF THE INVENTION

Photolithography is a fundamental technology in the production of semiconductor devices. In the integrated circuit lithographic process, a photosensitive polymer film is applied to the substrate, dried, and then exposed with the proper geometrical patterns through a photomask. After exposure, the wafer is soaked in a solution that develops the images in the photosensitive material. Depending upon the type of polymer used, either exposed or non-exposed areas of film are removed in the developing process.

A frequent problem encountered in this process is reflectivity of the activating radiation back into the resist by the substrate, especially by substrates containing highly reflecting, irregular topographies. Such reflectivity tends to cause standing wave ripples and reflective notches, which interfere with the desired pattern in the photoresist. The notches are particularly bad when the support or metallurgy is nonplanar.

The problem, as well as its cause, as discovered by us, is illustrated in FIG. 1 which depicts a substrate 1 containing numerous structures appropriate to integrated circuit function whose nature and function will be described later. The substrate has been covered with an insulator 32 and patterned with a series of channels 7, which will be used for wiring interconnections in semiconductor processing. The channels 7 are to be deepened and the insulator layer 32 is to be cut back slightly to create vias, contacts or interconnections between channels. As shown in FIG. 2, a layer of photoresist has been deposited on the insulator 32 and has been exposed and developed. Because of reflected radiation during the exposure step, the development of the photoresist 36 has removed a notch 3 where a straight side was intended. As a result, when the photoresist is used as an etch mask, etching occurs in a region that was to have been protected by the resist. When the photoresist is stripped, the insulator layer 32 appears as shown in FIG. 3 having a portion of the insulator etched away where a vertical wall had been intended. When the channel is filled with a suitable metal and planarized, the metal 46 has an extension 5 which intrudes into the region which was supposed to be occupied by insulator. The extension 5 gives rise to shorting and circuit failure, particularly when the dimensions are critical.

The art discloses three basic approaches to the problem: (1) decrease the intensity or time of exposure to the radiation; (2) incorporate a radiation absorber into the photoresist; and (3) incorporate a dye or other chromophore of appropriate absorption into a removable polymer layer beneath the resist. Each of these approaches has its attendant drawbacks: Decreasing the intensity or duration of the exposure decreases reflective radiation but also decreases the radiation necessary for efficient exposure. This becomes an acute problem when creating sub-micron features. The result of underexposure is blocked or partially blocked contact/via openings due to residual resists remaining in the pattern after photodeveloping and subsequent etching. The incorporation of a radiation absorber into the photoresist itself cuts down on reflected radiation but also results in decreased resist sensitivity. In the third approach, the radiation absorbing layer beneath the resist has, in the prior art, been of such a nature that its removal was required prior to any subsequent deposition of metal. This adds additional steps to the process, and removal of the absorber can affect exposed regions in the contact/via openings.

There thus remains a continuing need for a process that precisely defines metallization in an insulator layer and that avoids the foregoing drawbacks.

SUMMARY OF THE INVENTION

It is an object of the present invention to provide a process for high definition metallization.

It is a further object to provide an anti-reflective layer that can be directly coated with a metal.

It is a further object to provide improved adhesion between a metal and an insulator for the creation of metal features in an insulator layer.

These and other objects' features and advantages are realized in the present invention which relates generally to a process for making metal features in an insulator layer.

In one aspect, invention relates to a process comprising the steps of:

a. providing an insulator layer on a substrate;

b. depositing a layer of titanium nitride on the insulator layer;

c. patterning both of the insulator and titanium nitride layers with a plurality of apertures or channels;

d. optionally depositing a second film of titanium or titanium nitride over the titanium nitride and the apertures or channels;

e. depositing a metal over the titanium nitride (or, when present, titanium,); and f. optionally removing both the metal and the titanium nitride over the insulator layer so as to create a pattern of metallization in the insulator layer.

In most embodiments, the apertures will extend through the insulator layer and into the substrate. The apertures, when filled and planarized, may become features such as vias and contacts; the channels may become features such as local interconnects. The patterning of the insulator and titanium nitride layers will be accomplished by depositing, exposing and developing a photoresist on the titanium nitride layer, etching both the insulator and the titanium nitride layers, and removing the photoresist. Preferred metals for the metallization include tungsten, copper, aluminum and molybdenum.

In another aspect, the invention relates to a process comprising the steps of:

(a) providing an insulator layer on a substrate;

(b) depositing a first layer of a material that attenuates reflected radiation (an ARC) on the insulator layer;

(c) depositing a photoresist on the ARC;

(d) exposing and developing the photoresist;

(e) etching both the insulator and the ARC to form a plurality of apertures or channels;

(f) removing the photoresist;

(g) optionally depositing a second film of a material that attenuates reflected radiation (a second ARC) over the first ARC and in the apertures or channels; the second material need not be the same as the first, but can be;

(h) depositing a metal over the ARC and in the apertures or channels that are not covered by ARC; and (i) optionally removing the metal and ARC from the insulator layer so as to create a metallization pattern in the insulator layer.

As before, in most embodiments the apertures will extend through the insulator layer and into the substrate. When the metal is copper, a preferred ARC is tantalum; when the metal is aluminum, a preferred ARC is titanium; and when the metal is tungsten, a preferred ARC is titanium nitride.

DETAILED DESCRIPTION OF THE INVENTION

The process of the invention involves the deposition of an anti-reflective coating (ARC) on an insulator layer, patterning of the ARC using a photoresist, etching both the ARC and the insulator, removing the photoresist, and depositing the metal for interconnects, vias, contacts etc. over the ARC to fill the channels and apertures. The metal is then planarized back to the insulator, commonly by chemical-mechanical polishing (CMP), to provide a planarized insulator containing the appropriate metallization. In most cases, the ARC will provide improved adhesion between the metal and insulator so that the resulting structure can be chemicalmechanical polished without pulling the metal out of any of the features. However, in some instances it may be desirable to conformally deposit a thin additional layer of ARC, particularly titanium, titanium nitride or a bilayer of the two into the apertures and channels to further improve adhesion.

In the examples that follow, titanium nitride has been used as an ARC for the deposition of tungsten; however, the invention is by no means limited to such a combination. Other materials that attenuate reflected radiation and that improve adhesion can be used as the ARC as long as they will both survive the deposition of metal without loss of function and not interfere with the subsequent function of the device. In this respect, tantalum as an ARC for copper, titanium as an ARC for aluminum, and titanium nitride as an ARC for tungsten are particularly attractive combinations.

The use of the process of the invention is better understood by reference to FIGS. 4–8.

Figure 1:
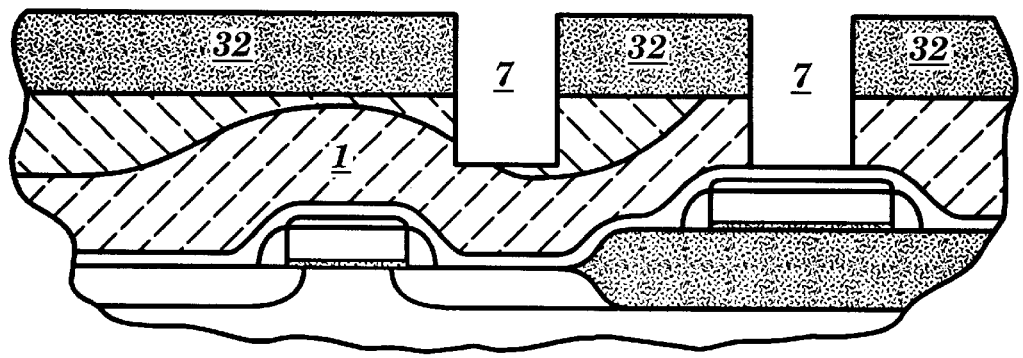
FIGS. 1–4 are schematic cross-sections of fabrication that does not employ the process of the invention
Figure 2:
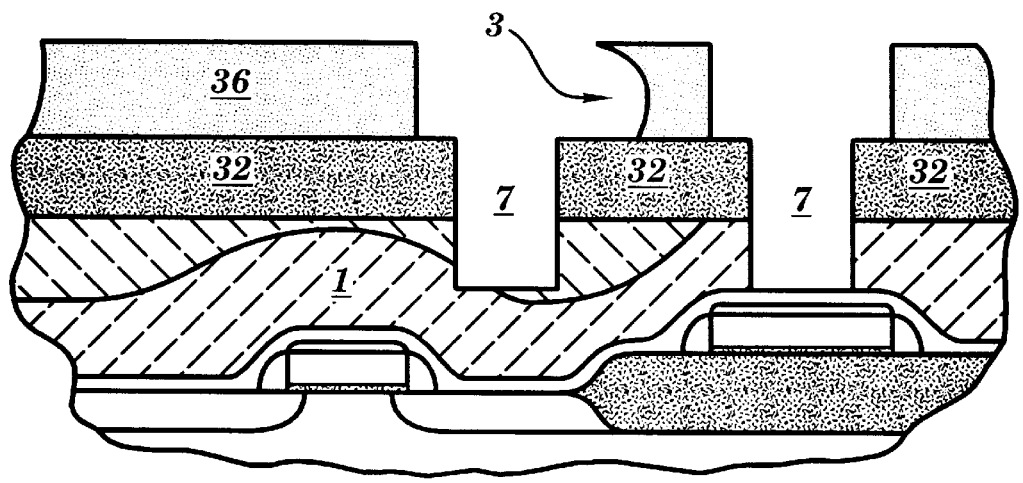
Figure 3:
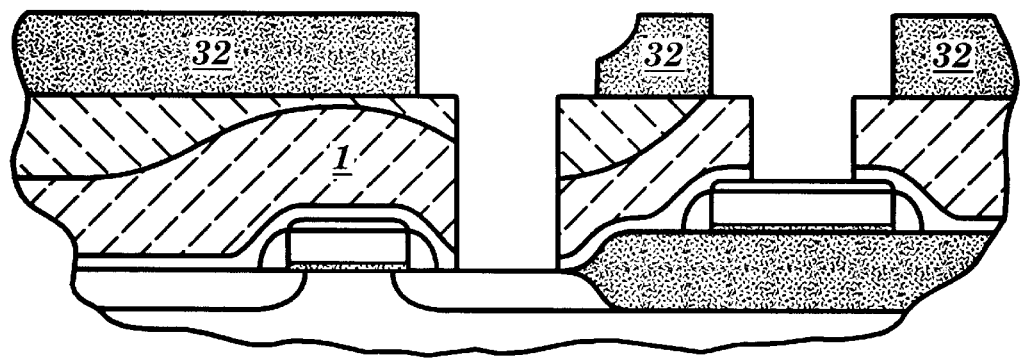
Figure 4:
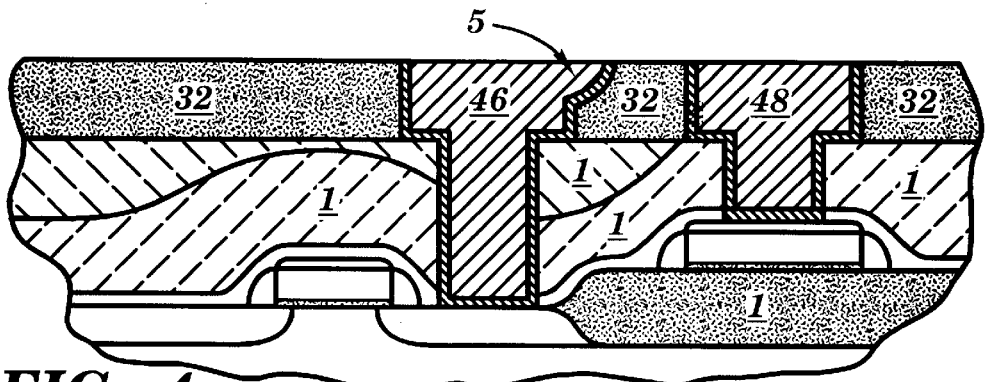
Figure 5:
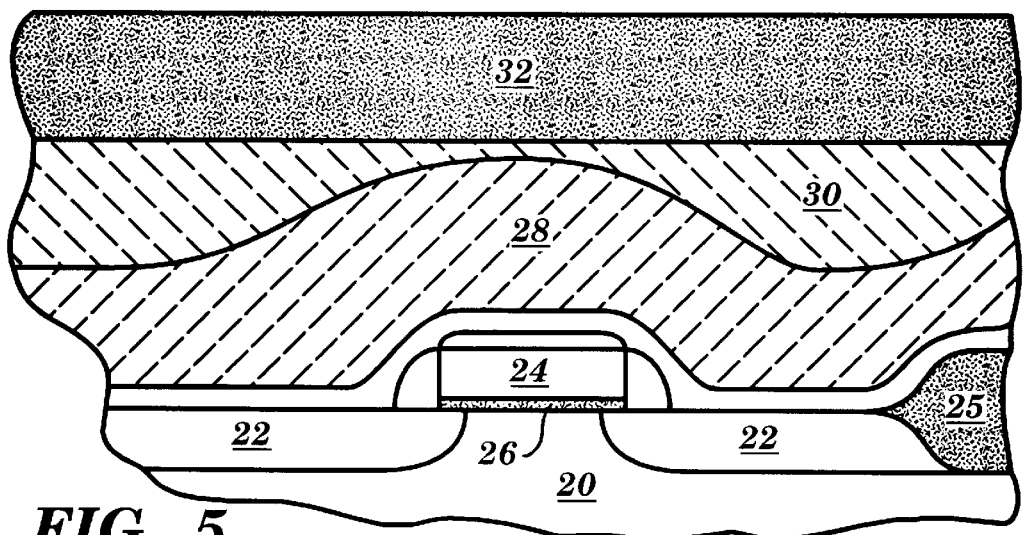
FIGS. 5–9 are schematic cross-sections of a device at sequential steps in a process according to the invention.

FIG. 5 shows a typical semiconductor fabrication at the stage of processing wherein a silicon substrate 20 has been provided with two diffusions or doped regions 22 and a conducting layer 24, of polysilicon, which will form a gate electrode in the semiconductor device which is to be formed on the silicon substrate. The conducting layer 24 has an electrically insulating layer 26 separating it from substrate 20 and diffusions 22. In the particular embodiment shown, it is the sloping "bird's beak" of the field oxide 25 that gives rise to the reflection problem, but similar problems can arise with shallow trench isolations (STI's) and other reflective features in layers below the resist. A layer of boron phosphorous silicate glass 28 and a layer of phosphorous silicate glass 30 have been deposited and reflowed, although for other applications two layers would not be necessary. Finally the insulator 32, in this case silicon dioxide, has been deposited by CVD and planarized.

Figure 6:
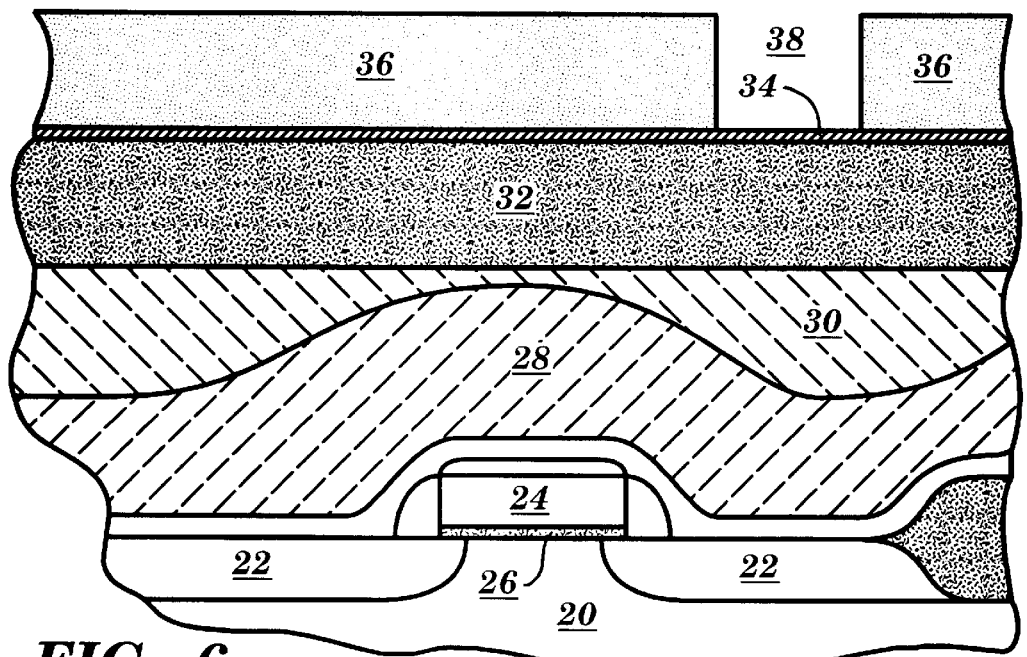
Figure 7:
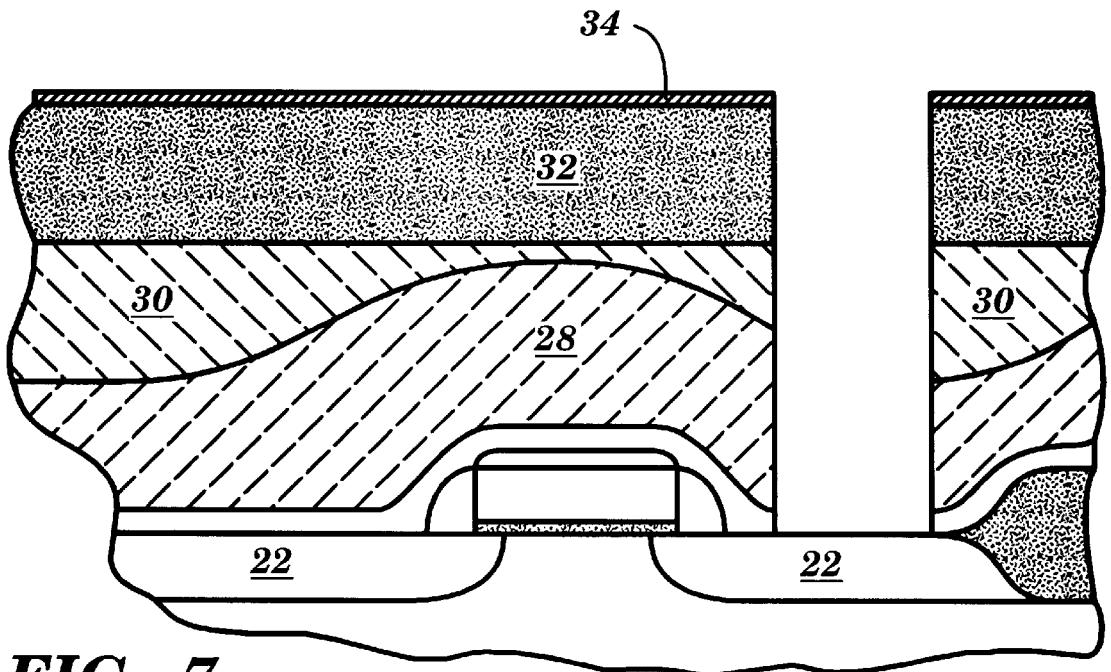
Figure 8:
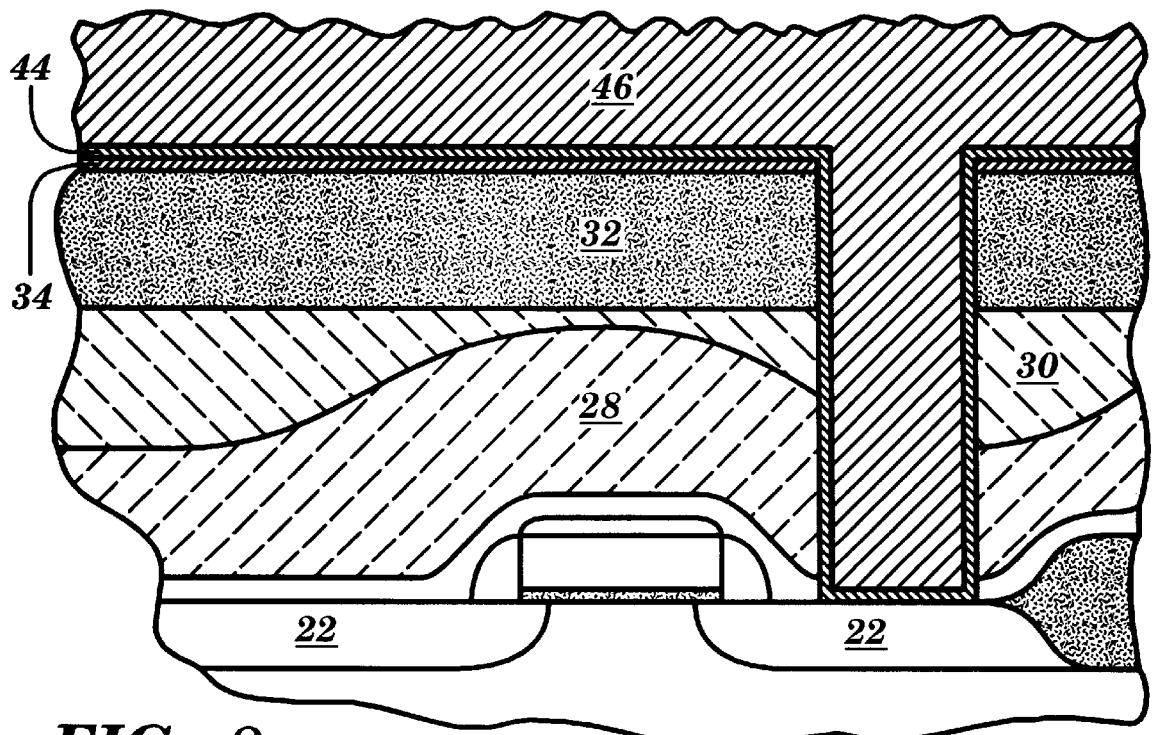
Figure 9:
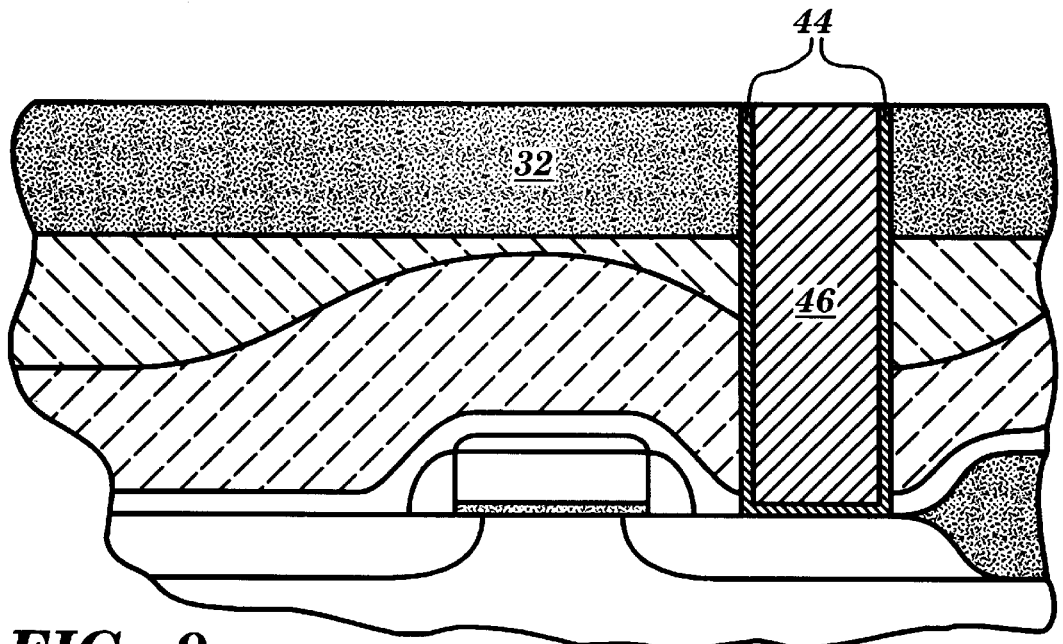

At this point, as shown in FIG. 6, the titanium nitride anti-reflective coating 34 is conformally deposited. A photoresist 36 is laid down on top of the titanium nitride, patterned, and developed to provide a series of openings 38. The wafer is etched, in this case by reactive ion etching (RIE) with $CHF_3$ plus $CO_2$. The etch cuts through the TiN 34 the CVD oxide 32, and the reflowed glass (28 and 30) to the substrate above the diffusion 22. The photoresist is then removed, resulting in a structure shown in FIG. 7. For improved adhesion, a second layer 44 of titanium/titanium nitride is conformally deposited to coat the surface of the existing ARC and the trench structure. This may be conveniently accomplished by sputtering titanium, first using argon as a bombarding species and then introducing nitrogen. (see for example U.S. Pat. Nos. 4,783,248 and 4,920,073) Tungsten 46 is then deposited to completely fill the trench and extend over the titanium nitride layer as shown in FIG. 8. Using the CVD oxide 32 as an etch stop, the tungsten is CMP planarized to provide the structure shown in FIG. 9 wherein the tungsten remains in the trench and the surface has been freed of anti-reflective coating, with a layer of ARC 44 remaining between the tungsten metallization 46 and the walls of the oxide and glass. This provides a tungsten stud which is mechanically stable and electrically reliable.

In some processes it will be desirable to add additional steps, such as a mask sequence to further pattern the CVD oxide, before deposition of the final ARC film and tungsten. Such a process, which employs the same ARC for two successive patternings and etches of the insulator is illustrated in FIGS. 10–15.

Figure 10:
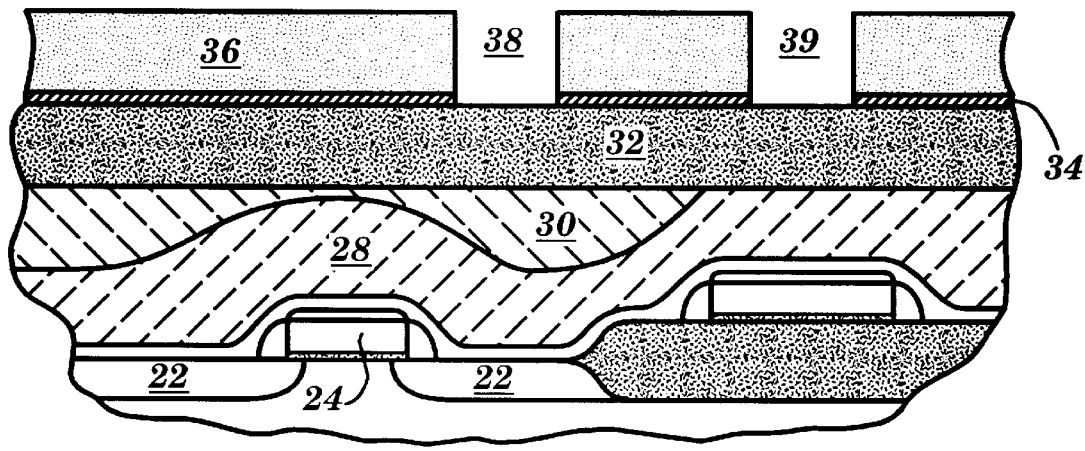
FIGS. 10–15 are schematic cross-sections of a device at sequential steps in a second embodiment of the process of the invention.
Figure 11:
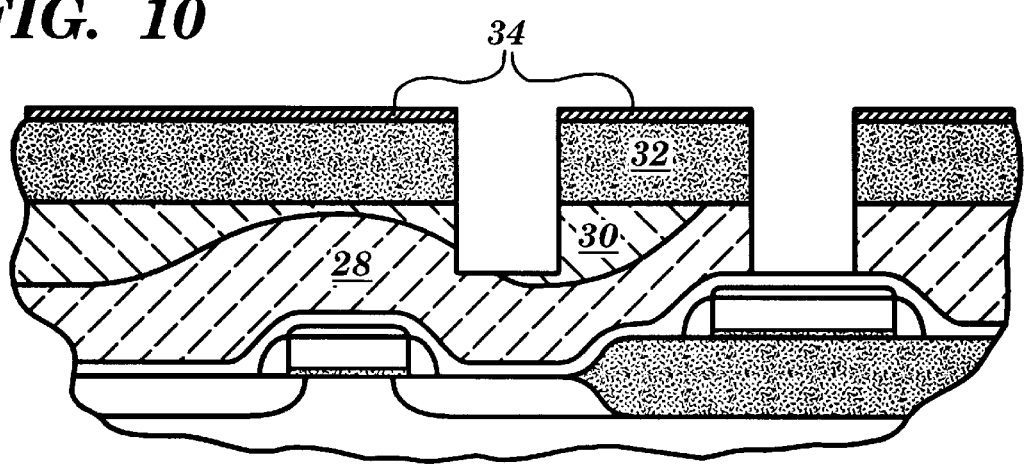
Figure 12:
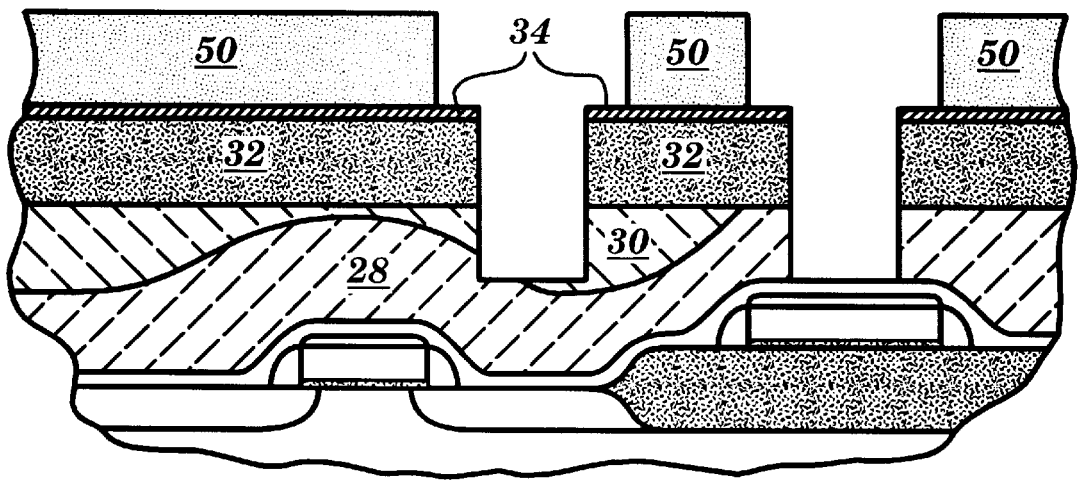
Figure 13:
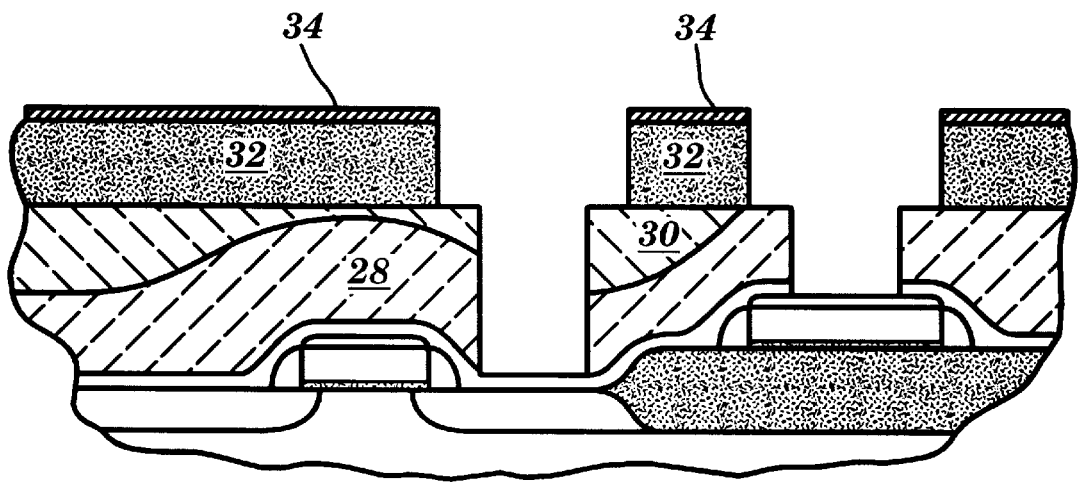
Figure 14:
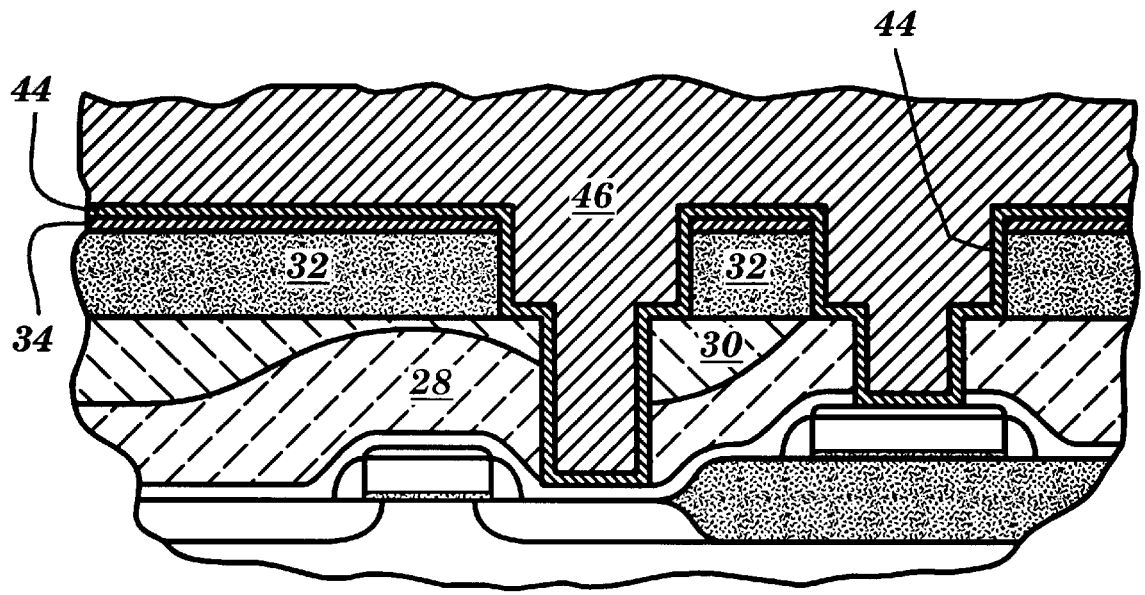
Figure 15:
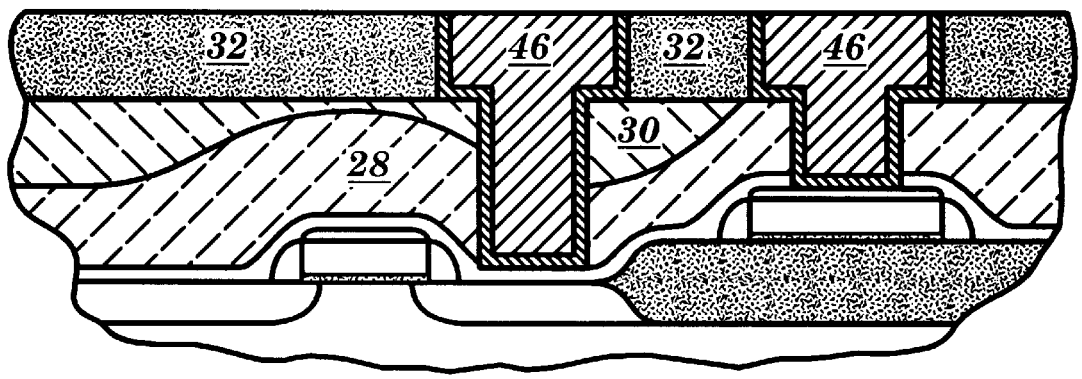

FIG. 10 shows a typical semiconductor fabrication similar to that described in FIGS. 5–9. In this case, two openings 38 and 39 have been provided in the photoresist 36 and the ARC has been etched from the openings. In this case, the etch of the insulator layer is extended part way into the glass layers 28 and 30 and the first photoresist is removed as shown in FIG. 11. A second photoresist 50 is laid down and patterned using the ARC 34, once again, to minimize reflected radiation and maximize the accuracy of the pattern. In this case, in the particular cross-section shown in FIG. 12, the opening is wider than was the case with the first photoresist. The remaining steps are analogous to those described in FIGS. 7–9 of the previous embodiment. A second layer 44 of titanium/titanium nitride is conformally deposited to coat the surface of the ARC and the trench structure. Tungsten 46 is deposited to completely fill the trench and extend over the Ti/TiN and the tungsten is CMP planarized to provide the structure shown in FIG. 15.

While the invention has been particularly shown and described with reference to preferred embodiments thereof, it will be understood by those skilled in the art that other changes in form and details may be made therein without departing from the spirit and scope of the invention.

We claim:

1. A process for making metal features in a planarized insulator layer, comprising the steps of:

(a) providing a planarized insulator layer on a substrate wherein, said substrate includes a conducting layer parallel to and underlying the top surface of said substrate and parallel to said planarized insulator layer;

(b) depositing, on said planarized insulator layer, a first layer of a material that attenuates reflected radiation;

(c) depositing a photoresist on said layer of material that attenuates reflected radiation;

(d) exposing and developing said photoresist layer;

(e) etching both of said planarized insulator layer and said layer of material that attenuates reflected radiation, to form a plurality of apertures or channels;

(f) removing said photoresist layer;

(g) depositing a layer of titanium, titanium nitride, or a bilayer of the two over at least a portion of the first layer of material, and in at least a portion of said apertures or channels;

(h) depositing a metal over at least a portion of the layer of titanium, titanium nitride, or the bilayer of the two, and in at least a portion of said apertures or channels; and (i) removing by etchback planarization, from the top surface of the planarized insulator layer, all of the metal, all of the first layer of material that attenuates reflected radiation, and all of the layer of titanium, titanium nitride or bilayer of the two which reside over the planarized insulator layer, to create a pattern of metallization in the apertures or channels.

2. A process according to claim 1 wherein said apertures or channels extend through said insulator layer and into said substrate.

3. A process according to claim 1 wherein said layer of material that attenuates reflected radiation comprises tantalum and said metal is copper.

4. A process according to claim 1 wherein said layer of material that attenuates reflected radiation comprises titanium and said metal is aluminum.

5. A process according to claim 1 wherein said layer of material that attenuates reflected radiation comprises titanium nitride and said metal is tungsten.

6. A process according to claim 1 comprising the additional steps, following (f) and preceding (g), of depositing a second photoresist on said layer of material that attenuates reflected radiation; exposing and developing said second photoresist layer; and etching both of said insulator layer and said layer of material that attenuates reflected radiation.

7. A process for making metal features in a planarized insulator layer, comprising the steps of:

(a) providing a planarized insulator layer on a substrate, wherein said substrate includes a conducting layer parallel to and underlying the top surface of said substrate and parallel to said planarized insulator layer;

(b) depositing a first layer of titanium nitride on said planarized insulator layer;

(c) patterning both of said planarized insulator and said titanium nitride layers with a plurality of apertures or channels;

(d) depositing a second layer of titanium, titanium nitride, or a bilayer of the two over at least a portion of the first layer of titanium nitride, and in at least a portion of said apertures or channels;

(e) depositing a metal over at least a portion of the second layer, and in at least a portion of said apertures or channels; and (f) removing by etchback planarization, from the top surface of the planarized insulator layer, all of the metal, all of the first layer of titanium nitride, and all of the second layer of titanium, titanium nitride or bilayer of the two which reside over the planarized insulator, to create a pattern of metallization in the apertures or channels.

8. The method of claim 7, wherein step (d) is carried out to improve the adhesion between the insulator layer and the metal deposited in step (e).

9. A process according to claim 7 wherein said apertures or channels extend through said insulator layer and into said substrate.

10. A process according to claim 7 wherein said patterning of said insulator and titanium nitride layers is carried out by depositing, exposing and developing a photoresist on said titanium nitride layer; etching both of said insulator and titanium nitride layers; and removing said photoresist.

11. A process according to claim 7 wherein said metal is chosen from the group consisting of tungsten, copper, aluminum, and molybdenum.

12. A process for making metal features in a planarized insulator layer, comprising the steps of:

(a) providing a planarized insulator layer on a substrate, wherein said substrate includes a conducting saver parallel to and underlying the top surface of said substrate and parallel to said planarized insulator layer;

(b) depositing, on said planarized insulator layer, a first layer of a material that attenuates reflected radiation and improves metal adhesion;

(c) depositing a photoresist on said first layer of material that attenuates reflected radiation and improves metal adhesion;

(d) exposing and developing said photoresist layer;

(e) etching both of said planarized insulator layer and said first layer of material that attenuates reflected radiation and improves metal adhesion, to form a plurality of apertures or channels;

(f) removing said photoresist layer;

(g) depositing a second layer of said material that attenuates reflected radiation and improves metal adhesion over at least a portion of the first layer of said material, and in at least a portion of said apertures or channels, wherein said material of said second layer is the same as that of said first layer;

(h) depositing a metal over at least a portion of the second layer of material and in at least a portion of said apertures or channels;

(i) removing by etchback planarization from the top surface of the planarized insulator layer, all of the metal and all of the first and second layers of material that attenuate reflected radiation and improve metal adhesion, which reside over the planarized insulator layer, to create a pattern of metallization in the apertures or channels.

13. A process according to claim 12, wherein said material that attenuates reflected radiation and improves metal adhesion is titanium, titanium nitride, or tantalum, and wherein said metal is aluminum when said material is titanium, said metal is tungsten when said material is titanium nitride, and said metal is copper when said material is tantalum.

14. A process according to claim 12 wherein said apertures or channels extend through said insulator layer and into said substrate.

15. A process according to claim 12 comprising the additional steps, following (f) and preceding (g), of depositing a second photoresist on said first layer of material that attenuates reflected radiation and improves metal adhesion; exposing and developing said second photoresist layer; and etching both of said insulator layer and said first layer of material that attenuates reflected radiation and improves metal adhesion.

* * * * *

UNITED STATES PATENT AND TRADEMARK OFFICE
CERTIFICATE OF CORRECTION

PATENT NO. : 5,882,999
DATED : Mar. 16, 1999
INVENTOR(S) : Anderson et al.

It is certified that error appears in the above-identified patent and that said Letters Patent is hereby corrected as shown below:

Column 6, line 16    after "conducting" delete "saver" and insert --layer--

Signed and Sealed this

Twenty-seventh Day of July, 1999

Attest:

Q. TODD DICKINSON

*Attesting Officer*    *Acting Commissioner of Patents and Trademarks*